US010217735B2

(12) United States Patent
Tesson et al.

(10) Patent No.: US 10,217,735 B2
(45) Date of Patent: Feb. 26, 2019

(54) SEMICONDUCTOR SWITCH DEVICE

(71) Applicant: NXP B.V., Eindhoven (NL)

(72) Inventors: Olivier Tesson, Bretteville l'Orgueilleuse (FR); Thomas Francois, Benouville (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/596,188

(22) Filed: May 16, 2017

(65) Prior Publication Data
US 2017/0373054 A1 Dec. 28, 2017

(30) Foreign Application Priority Data

Jun. 24, 2016 (EP) .................................. 16290115

(51) Int. Cl.
| H01L 23/62 | (2006.01) |
|---|---|
| H01L 27/02 | (2006.01) |
| H01L 29/06 | (2006.01) |
| H01L 23/522 | (2006.01) |
| H01L 23/528 | (2006.01) |
| H01L 29/417 | (2006.01) |

(52) U.S. Cl.
CPC ...... *H01L 27/0292* (2013.01); *H01L 23/5226* (2013.01); *H01L 23/5283* (2013.01); *H01L 27/0207* (2013.01); *H01L 27/0266* (2013.01); *H01L 29/0649* (2013.01); *H01L 29/0692* (2013.01); *H01L 29/41725* (2013.01); *H01L 29/41758* (2013.01)

(58) Field of Classification Search
CPC ............. H01L 27/0251; H01L 29/0692; H01L 27/0292; H01L 29/0649; H01L 29/41725
USPC ........................................................ 257/355
See application file for complete search history.

(56) References Cited

U.S. PATENT DOCUMENTS

| 5,040,035 | A | 8/1991 | Gabara et al. |
|---|---|---|---|
| 5,986,292 | A | 11/1999 | Mizuno et al. |
| 2007/0158746 | A1* | 7/2007 | Ohguro ................... H01L 21/84 257/350 |
| 2016/0247880 | A1 | 8/2016 | Tesson et al. |

OTHER PUBLICATIONS

Ohnakado, Takahiro et al; "A 0.8-dB Insertion-Loss, 17.4-dBm Power-Handling, 5 GHz Transmit/Receive Switch With DETs in a 0.18 um CMOS Process"; IEEE Electron Device Letters, vol. 24, No. 3; 3 pages (Mar. 2003).

(Continued)

*Primary Examiner* — Theresa T Doan

(57) ABSTRACT

A semiconductor switch device and a method of making the same. The semiconductor switch device includes a field effect transistor located on a semiconductor substrate. The field effect transistor includes a plurality of gates. Each gate includes a gate electrode and gate dielectric arranged in a loop on a major surface of the substrate. The loops formed by the gates are arranged concentrically. Each gate has a source region located adjacent an inner edge or outer edge of the loop formed by that gate and a drain region located adjacent the other edge of said inner edge and said outer edge of the loop formed by that gate.

15 Claims, 7 Drawing Sheets

(56) References Cited

OTHER PUBLICATIONS

Saha, Prabir K. et al; "A K-band nMOS SPDT Switch and Phase Shifter Implemented in 130nm SiGe BiCOMOS Technology"; IEEE Topical Meeting on Silicon Monolithic Integrated Circuits in RF Systems, San Diego, CA, US; 4 pages (Jan. 19-21, 2009).

Thrivikraman, Tushar K. et al; "The Impact of Technology Node Scaling on nMOS SPDT RF Switches"; Proceedings of the 3rd European Microwave Integrated Circuits Conference, Amsterdam, NL; 4 pages (Oct. 2008).

* cited by examiner

SEMICONDUCTOR SWITCH DEVICE

CROSS-REFERENCE TO RELATED APPLICATIONS

This application claims the priority under 35 U.S.C. § 119 of European patent application no. 16290115.1, filed Jun. 24, 2016 the contents of which are incorporated by reference herein.

BACKGROUND

This disclosure relates to a semiconductor switch device and to a method of making a semiconductor switch device.

Known RF (Radio Frequency) MOS (Metal-Oxide-Semiconductor) switches are based on a comb type layout. In this layout, the switch includes a gate that has a plurality of interconnected fingers. The fingers are interspersed with source and drain regions comprising elongate strips. Metal interconnects are provided to each source and drain region through a series of vias located at several points along each strip. Generally, the connection to the gate as made at one side of the device, at a common strip that interconnects each finger of the comb. The device may be surrounded by deep trench isolation (DTI). The DTI may be provided in the form of a mesh of trenches. This DTI implementation may generally increase the size of the device by a factor 2 or 3. Losses within such a switch may be relatively high. For instance, the isolation provided by the DTI surrounding the device does not affect substrate impedance within the device. The footprint of the active device itself may generally stay relatively wide and thus exhibit a lower substrate resistance, which may lead to higher insertion losses and a higher noise figure.

Scaling of such a device is also limited to adding additional fingers to the comb or by varying the length of the fingers.

Within a single-pole, single-throw (SPDT) switch there are several ways to provide electrostatic discharge (ESD) protection. One approach is to use ESD self-protected switches. In such an approach, only a first finger of the switch bears the ESD stress. The other fingers of the device do not participate in this respect because there is no domino effect in this kind of device. Because of this, the width of the first finger may be required to be relatively large, which may increase insertion losses and the noise figure of the device.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor switch device comprising a field effect transistor located on a semiconductor substrate, wherein the field effect transistor comprises a plurality of gates, each gate comprising a gate electrode and gate dielectric arranged in a loop on a major surface of the substrate, wherein the loops formed by the gates are arranged concentrically, and wherein each gate has a source region located adjacent an inner edge or outer edge of the loop formed by that gate and a drain region located adjacent the other edge of said inner edge and said outer edge of the loop formed by that gate.

According to another aspect of the present disclosure, there is provided a method of making a semiconductor switch device, the method comprising:

providing a semiconductor substrate having a major surface; and forming a field effect transistor on a semiconductor substrate by:

depositing and patterning a gate dielectric material and a gate electrode material on the substrate to form a plurality of gates, each gate comprising a gate electrode and gate dielectric arranged in a loop on a major surface of the substrate, wherein the loops formed by the gates are arranged concentrically, and for each gate, forming a source region located adjacent an inner edge or outer edge of the loop formed by that gate and a drain region located adjacent the other edge of said inner edge and said outer edge of the loop formed by that gate.

By providing the gates of the switch device in a plurality of concentrically arranged loops, the lengths of the gates may vary so that gates located towards a center of the device are shorter than those located away from the center. One of the longer gates of the device (e.g. an outermost gate) may be used the bear the electrostatic discharge (ESD) stress during an ESD event. Accordingly, the ESD robustness of the switch device may be relatively high for a given device size.

The switch device may further include at least one isolation region arranged in a loop. The loop formed by each isolation region may be located in between an inner edge of one of the gates and an outer edge of another of the gates. Since the isolation in such examples may be located in between the gates, the substrate impedance within the device area may be improved in a manner that cannot be achieved in devices in which isolation (e.g. DTI) is merely provided around the device periphery.

At least some of the source regions may be located in between one of the isolation regions and either an inner edge or an outer edge of the loop formed by one of the gates. At least some of the drain regions may be located in between one of the isolation regions and either an inner edge or an outer edge of the loop formed by one of the gates. Note that in such examples, the isolation regions may separate neighbouring source and drain regions from each other.

The plurality of gates may include an outermost gate, an innermost gate and at least one intermediate gate. In such examples, the loop formed by the at least one intermediate gate may be located inside the loop formed by the outermost gate, and the loop formed by the innermost gate may be located inside the loop formed by the at least one intermediate gate.

The loop formed by each gate may be rectangular, for complying with the design rules of existing semiconductor manufacturing techniques.

Each gate may include at least one contact area which extends along a common radial direction of the concentrically arranged loops. The device may further include a linear array of gate contacts. Each gate contact may be located on one of the contact areas. This arrangement may allow each gate to be connected to symmetrically (i.e. so that approximately one half of the gate is located one each side of the contact area), and in a manner in which the gate contacts may conveniently be connected to with a linear gate connection member. The gate contacts may extend down from an overlaying metallisation stack of the device. In some examples, each gate may include two contact areas located on opposite sides of the loop formed by that gate. Again, this arrangement of the contact areas may allow each gate to be connected to symmetrically.

The device may include either an innermost source region or an innermost drain region located at a center of the field effect transistor. In such examples, the source regions and drain regions may alternate with increasing radial distance from the center of the field effect transistor, with each source region being separated from a respective drain region by a respective one of the gates.

The device may include an array of source contacts and an array of drain contacts. The arrays of source and drain contacts may be arranged in loops for connecting to the source and drain regions. The source contacts and drain contacts may extend down from an overlaying metallisation stack of the device.

The device may include a metallisation stack located above the field effect transistor. The metallisation stack may include connection members for connecting to the gates, sources and drains of the field effect transistor. The connection members may thus be conveniently shaped using existing metallisation techniques, which may allow for close control of the shape and configuration of the connection members.

The metallisation stack may include a linear gate connection member extending along the common radial direction to connect to each of the abovementioned gate contacts.

The metallisation stack may include at least one source connection member which connects together source regions located on either side of one of the isolation regions. The source connection member(s) may connect to the abovementioned source contacts. The metallisation stack may include at least one drain connection member which connects together drain regions located on either side of one of the isolation regions. The drain connection member(s) may connect to the abovementioned drain contacts.

Each source connection member and each drain connection member may be located in a first metal level of the metallisation stack. The metallisation stack may include further source and drain connection members located in a second metal level thereof. The further source and drain connection members may interconnect the source connection members and the drain connection members located in the first metal level.

The further source and drain connection members located in the second metal level of the metallisation stack may include a plurality of interdigitated fingers. This arrangement may reduce losses associated with the interconnections formed by the metallisation stack.

In one embodiment, the device is an RF MOS switch.

According to a further aspect of this disclosure, there is provided a Radio Frequency (RF) circuit comprising a semiconductor switch device of the kind described above.

For the purposes of this application, radio frequency (RF) signals may be considered to be signals in the frequency range $1\ GHz \leq f \leq 40\ GHz$. For instance, the signals may be in the bands used for WLAN communications (e.g. 2.4-2.5 GHz & 4.9-5.92 GHz). In other examples, the RF signals may be in one of the following IEEE bands: L band=1-2 GHz, S band=2-4 GHz, C band=4-8 GHz, X band=8-12 GHz, $K_u$ band=12-18 GHz, K band=18-27 GHz, $K_a$ band=26.5-40 GHz.

Embodiments of this invention may, for instance, be used in LTE/WLAN integrated circuits (ICs), such as those incorporating low noise amplifiers and a switch, and front end integrated circuits ICs.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

FIGS. 1 to 7 illustrate a number of process steps for making a semiconductor switch device 10 according to embodiments of the present disclosure.

Figure 1:
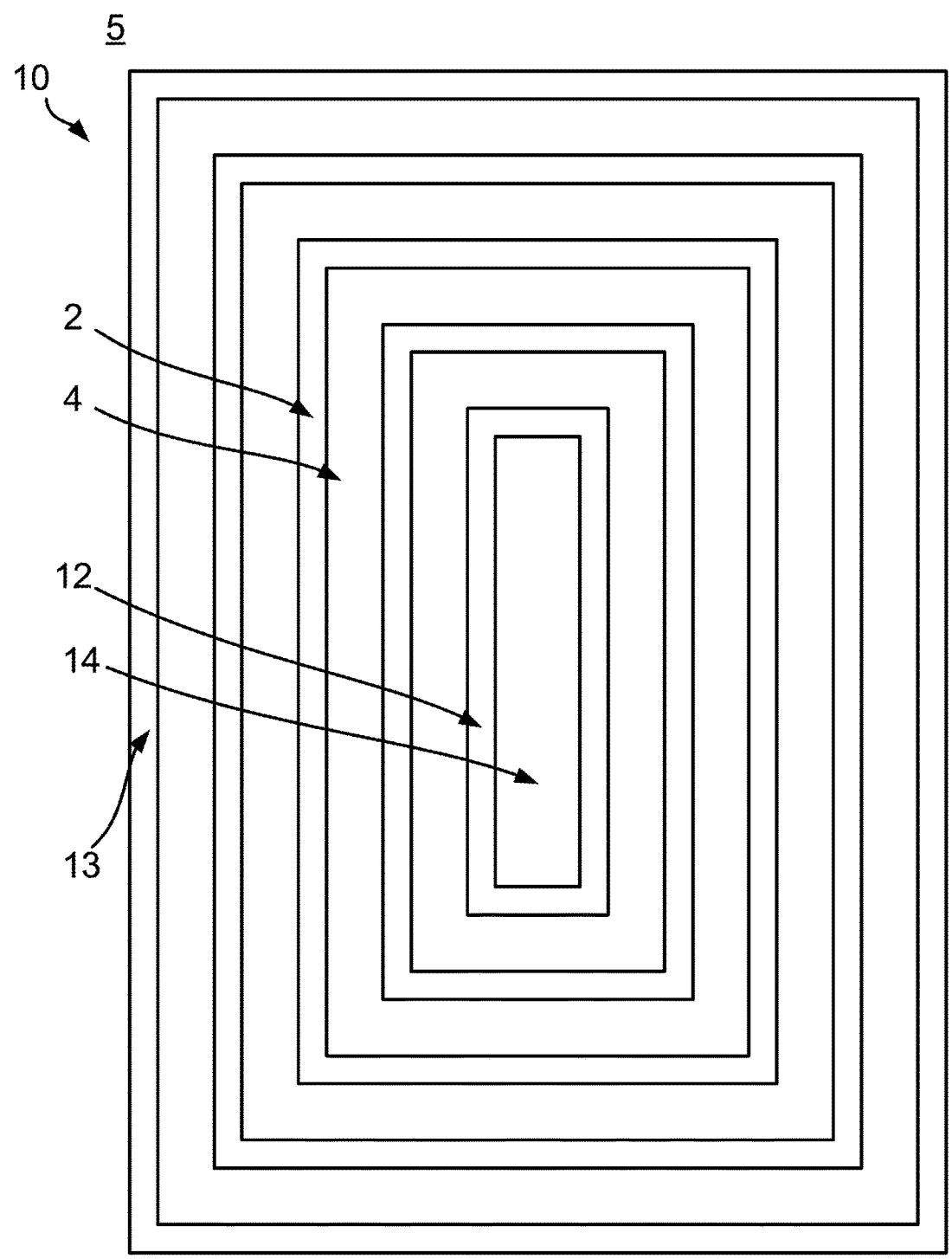
FIGS. 1 to 7 illustrate a number of process steps for making a semiconductor switch device according to embodiments of the present disclosure.

In a first stage shown in FIG. 1, there is provided a semiconductor substrate having a major surface 5. The substrate may, for instance, be a silicon substrate. It is envisaged that a silicon-on-insulator (SOI) substrate may be used. As shown in FIG. 1, isolation regions 2 may be formed at the major surface 5. These isolation regions 2 may typically comprise a series of trenches formed (typically by etching, e.g. using Deep Reactive Ion Etching (DRIE)) in the major surface 5, where the trenches are filled with a dielectric such as an oxide. In one example, the isolation regions 2 may comprise so-called Deep Trench Isolation (DTI). The depth of the trenches may be in the range 6-16 μm, depending on the level of isolation required. In the present example, the loop formed by each isolation region 2 is a closed, unbroken loop. In this way, the substrate impedance within the device 10 may be increased compared to, for instance, a loop having one of more breaks in it.

The isolations regions 2 in this example are arranged in a plurality of concentrically arranged loops. The loops formed by the isolation regions 2 may include an innermost loop 12, an outermost loop 13 and a number of intermediate loops. In this example, each loop is rectangular (e.g. oblong or square). As shown in FIG. 1, the loops formed by the isolation regions 2 define areas 4 in the spaces between the loops. The innermost loop 12 may form an innermost area 14, located inside the innermost loop 12. As will be described below, the gate(s), source(s) and drain(s) of the device 10 will be located in these areas 4, 14.

Figure 2:
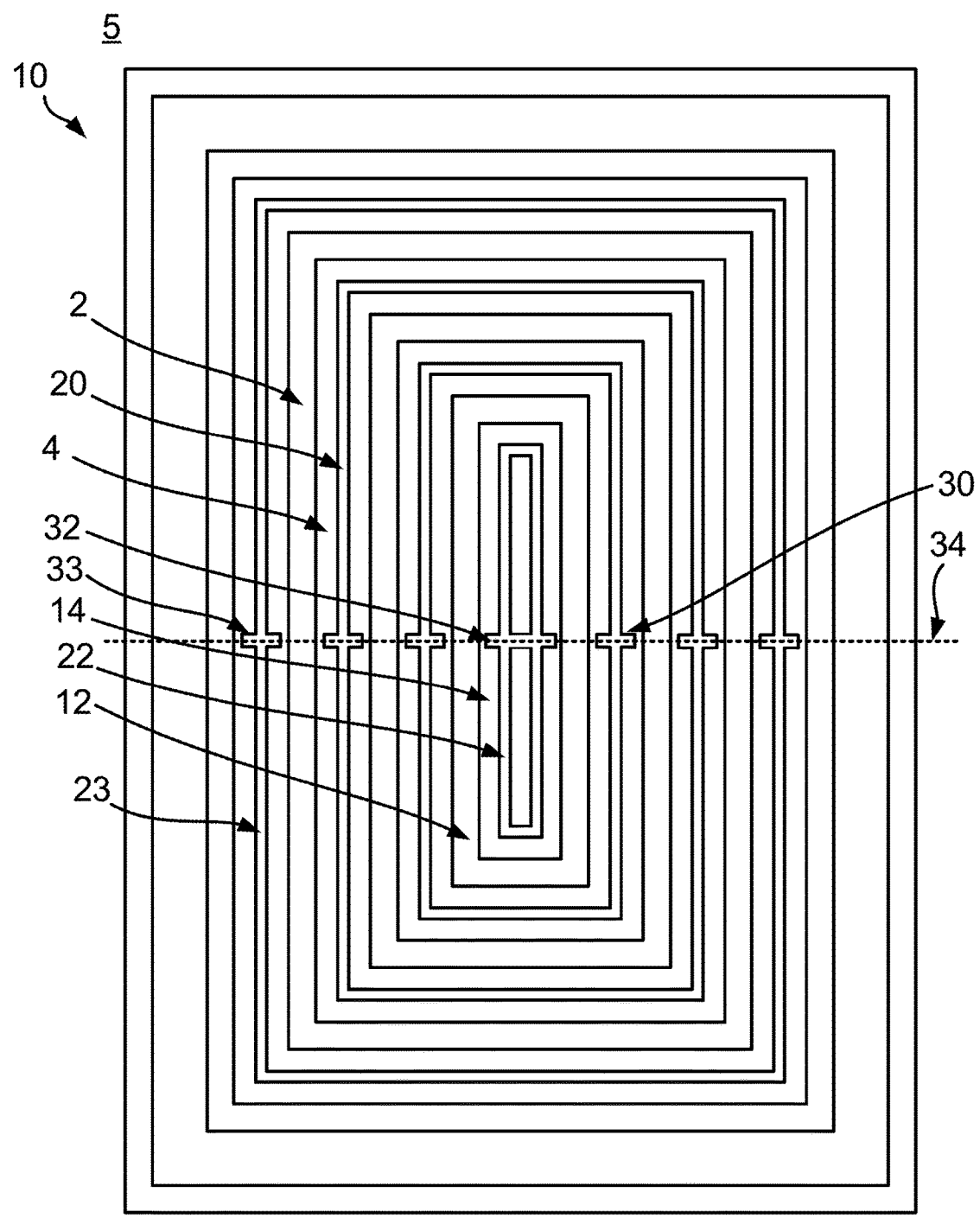

FIG. 2 shows a next stage in the manufacture of the device 10, in which a plurality of gates 20 are formed on the major surface 5 of the device 10. Each gate 20 may comprise a gate electrode located on top of a gate dielectric (e.g. an oxide) located on the major surface 5. The gate electrodes may, for instance, comprise polysilicon. The gates 20 may be formed using known deposition and patterning techniques, for depositing and patterning the gate dielectric and gate electrode material.

The gates 20 in this example are located in the areas 4, 14 defined by the loops of the isolation regions 2. The gates 20 may include an innermost gate 22 located inside the innermost loop 12. The gates 20 may also include an outermost gate 23. The gates 20 may further include one or more intermediate gates located in between the innermost gate 22 and the outermost gate 23.

The gate electrodes and gate dielectric forming the gates 20 are arranged in loops on the major surface 5 of the substrate. As with the isolation regions 2 described above, the loops formed by the gates 20 are arranged concentrically. Note that in this example, the centre of the loops formed by the gates 20 coincides with the centre of the loops formed by the isolation regions 2. Also as described in relation to the isolation regions 2, the loops formed by the gates 20 may be rectangular (e.g. oblong or square).

In this example, each gate 20, 22 has an inner edge (the edge closest to the center of the loops formed by the gates 20, 22) and an outer edge (the edge furthest to the center of the loops formed by the gates 20, 22). As will be described below, the source(s) and drain(s) of the device 10 will be located adjacent the inner and outer edges of the gates 20, 22.

As shown in FIG. 2, each gate 20 may be provided with one or more contact areas 30. These contact areas 30 may include an innermost contact area 32 (which belongs to the innermost gate 22) and an outermost contact area 33 (which belongs to the outermost gate 23). In this example, each contact area 30, 32 comprises a region of the gate 20, 22 which extends laterally outward from the inner and/or outer edges of each gate 20, 22, along a common radial direction (indicated in FIG. 2 using the dotted line labelled 34) of the concentrically arranged loops formed by the gates 20, 22. In this example, each gate 20, 22 includes two contact areas 30, 32, which are located on opposite sides of the loop formed by that gate 20, 22. As will be described below, this arrangement conveniently allows electrical connections to be made for applying a potential to the gates 20, 22 in a manner that is balanced and symmetrical.

Figure 3:
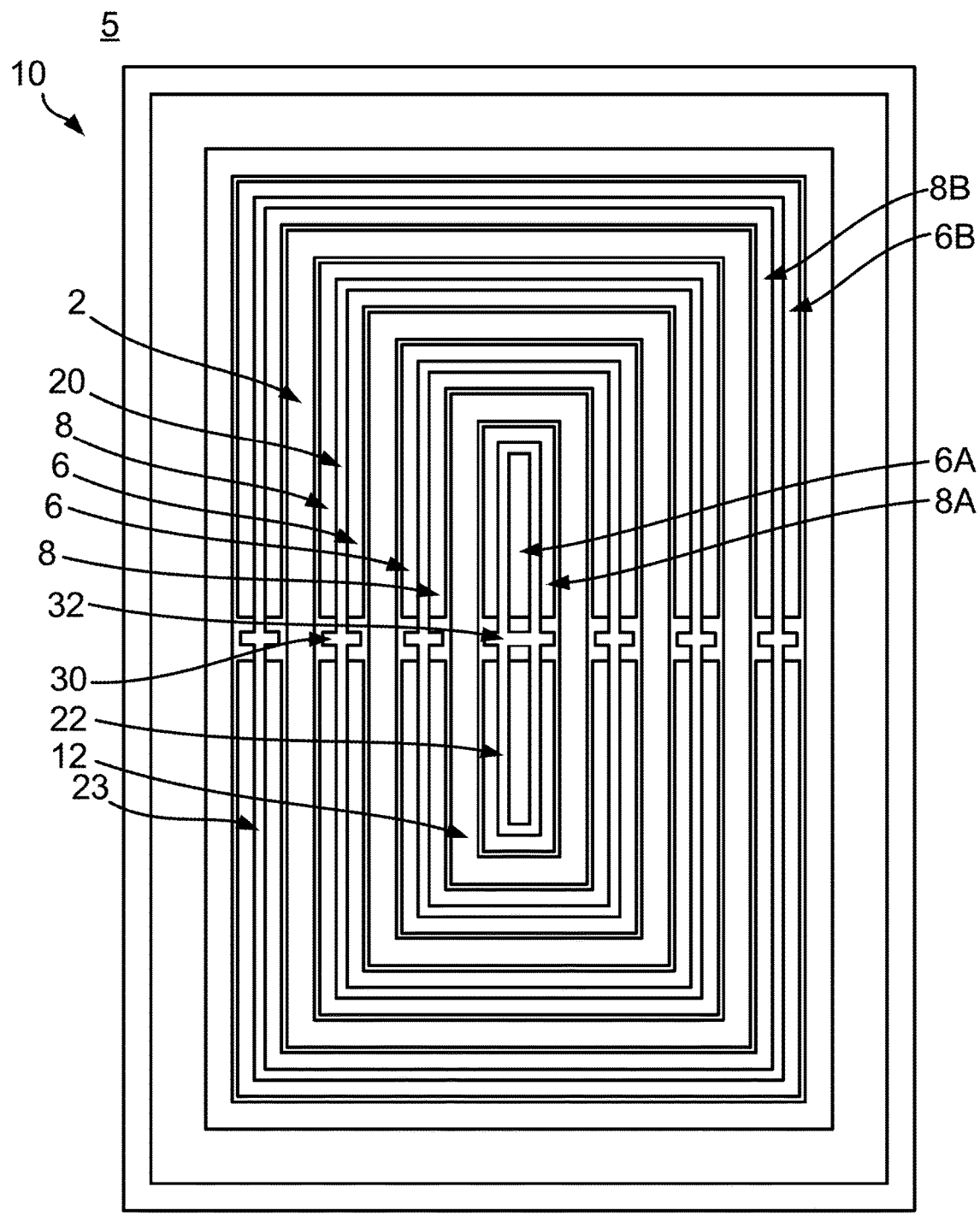

FIG. 3 shows a next stage in the manufacture of the device 10, in which a number of source regions 6 and drain regions 8 are formed. The source regions 6 and drain regions 8 may, for instance, be formed by using masking and ion implantation steps, selectively to dope the areas near of the major surface 5 of the substrate located adjacent the inner and outer edges of the loops formed by the gates 20, 22. As can be seen in FIG. 3, the regions of the device 10 close to the contact areas 30 may not be doped in this manner, to avoid any potential shorting between the gate contacts and the source and drain regions 6, 8.

The source regions 6 may include an innermost source region 6A and an outermost source region 6B. Similarly, the drains regions 8 may include an innermost drain region 8A and an outermost drain region 8B. Note that in this example, the innermost source region 6A and the innermost drain region 8A are both located inside the innermost loop 12 formed by the isolation regions 2. Also in this example, the innermost source region 6A is located adjacent the inner edge of the innermost gate 22, while the innermost drain region 8A is located adjacent the outer edge of the innermost gate 22. It is envisaged that this arrangement may be reversed, so that the innermost source region 6A is located adjacent the outer edge of the innermost gate 22, while the innermost drain region 8A is located adjacent the inner edge of the innermost gate 22.

As noted above, the source regions 6 and drain regions 8 are located adjacent the inner and out edges of the gates 20, 22. Accordingly, each gate 20, 22 has a source region 6 located on one edge and a drain region 8 located on the other edge, so that each gate region 20, 22 separates a source region 6 form a drain region 6. As can be seen in FIG. 3, the source regions 6 and drain regions 8 are provided in alternate pairs (except for the innermost and outermost source regions 6A, 6B and the innermost and outermost drain regions 8A, 8B), which each source region 6 or drain region 8 in each pair being located on either side of one of the loops formed by the isolation regions 2.

It will be appreciated that the source regions 6 (except for the innermost source region 6A) and the drain regions 8, 8A, 8B in this example are themselves arranged in a plurality of concentrically arranged loops (each loop optionally having a break in it located near to the contact areas 30, 32). The loops formed by the source regions 6 and the drain regions 8, 8A, 8B may be substantially the same shape as the loops formed by the gates 20, 22 and the isolation regions 2 (which are rectangular (e.g. oblong or square) in this example). The centre of the loops formed by the source regions 6 and the drain regions 8, 8A, 8B may coincide with the centres of the loops formed by the gates 20, 22 and the isolation regions 2.

In accordance with embodiments of this disclosure, because the isolation regions 2 are located in amongst the gates 20, 22, source regions 6 and drain regions 8 of the device 10, the substrate resistance within the device may be increased compared to known devices in which the isolation regions are located outside the part of the device that contains the source(s), gate(s) and drain(s). Accordingly, the substrate impedance within the device area containing the source regions 6, gates 20, 22 and drain regions 8 may be improved in a manner that cannot be achieved in devices in which isolation (e.g. DTI) is merely provided around the device periphery.

In accordance with embodiments of this disclosure, because the gates 20 are provided as a plurality of concentrically arranged loops, the size (length) of the gates 20 increases towards the outermost edges of the device 10, compared to at the gates 20 located toward the center of the device 10. This arrangement may allow a device 10 having gates 20 of various lengths to be provided. In accordance with embodiments of this disclosure, one of the longer gates 20 within the device 10 (for instance, the outermost gate 23) may be used to bear the ESD stress during an ESD event. Accordingly, the ESD robustness of the switch device 10 may be relatively high for a given device size.

Figure 4:
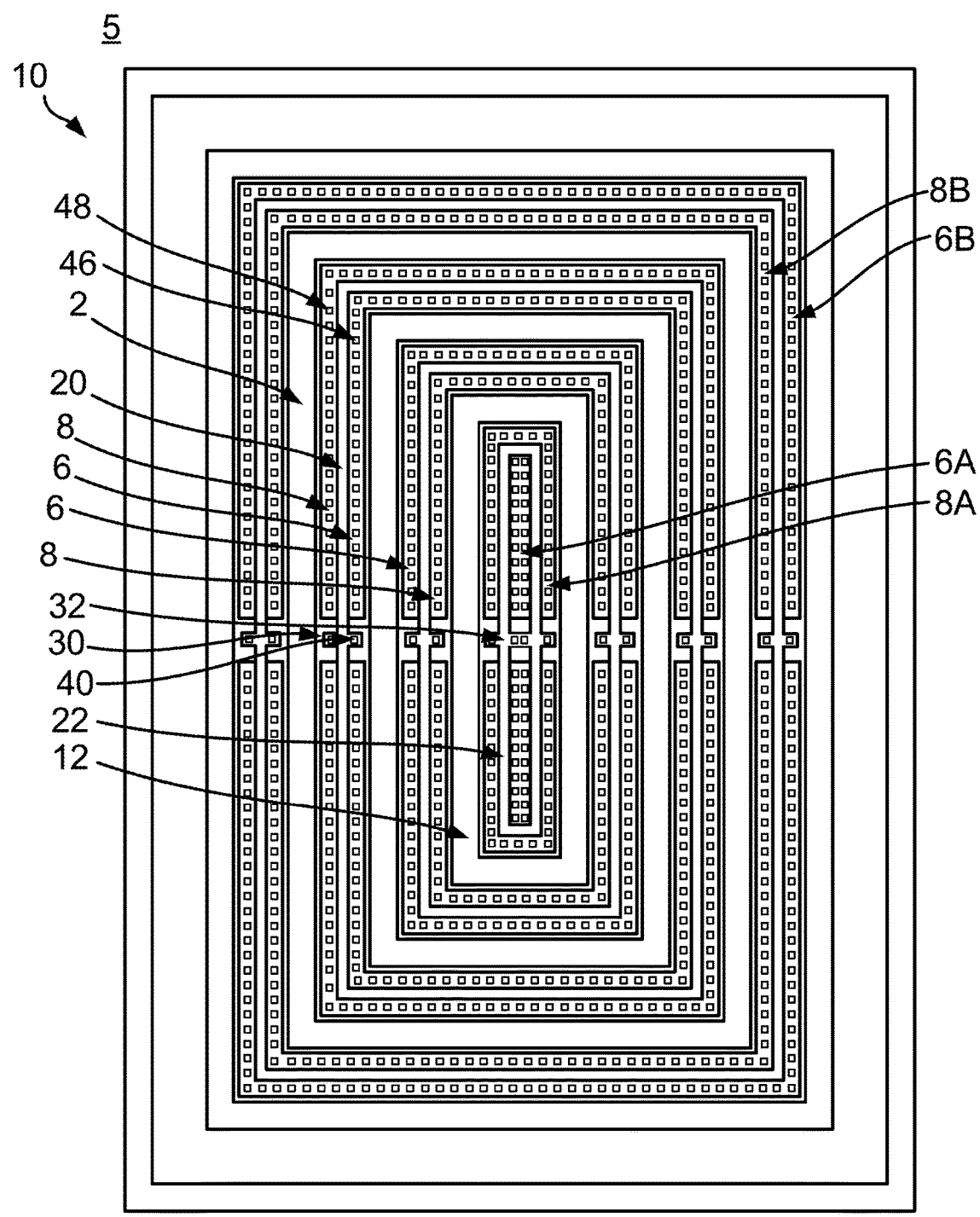

FIG. 4 shows a next stage in the manufacture of the device 10, in which a number of contacts are formed for making electrical connections to the source regions 6, gates 20 and drain region 8. The contacts may comprise any suitable electrically conductive material (e.g. polysilicon, a metal or alloy). The contacts may be formed using known deposition and patterning steps. Each contact may extend upwardly from the source region 6, gate contact region 30 or drain region 8 to which it connects and may, for instance, be rectangular (e.g. square) in cross section when viewed from above the major surface 5. As will be described below, the various contacts of the device 10 may connect to the features of a metallisation stack located above the major surface 5.

In this example, the contacts of the device 10 include a plurality of source contacts 46, which are located on the source regions 6 and a plurality of drain contacts 48, which are located on the drain regions 8. The source contacts 46 and drain contacts 48 may be located at regularly spaced intervals around each loop formed by the source regions 6 and drain regions 8. Accordingly, the source contacts 46 and drain contacts 48 may be provided as an array of source contacts and an array of drain contacts, in which the arrays of source and drain contacts are arranged in loops for connecting to the source regions 6 and drain regions 8. The innermost source region 6A may be provided with source contacts arranged in one or more rows as shown in FIG. 4.

In this example, the contacts of the device 10 include a plurality of gate contacts 40. The gate contacts 40 are located on the contact areas 30, 32 described above. The gate contacts 40 may thus be arranged in a linear row, the row extending along the common radial direction 34 described above in relation to FIG. 2. Conveniently, this may allow a substantially linear gate connection member to be used to form an electrical connection to the gates 20, 22 of the device 10 (see below) for applying a potential to the gates 20, 22 in a manner that is balanced and symmetrical.

In the following stages of the method of manufacturing a switch device 10 according to the present disclosure, a metallisation stack may be formed above the major surface 5. The metallisation stack may include features (connection members) for electrically connecting to the source regions 6, gates 20 and drain regions 8 via the contacts described above in relation to FIG. 4. The metallisation stack may be formed using known metallisation techniques (BEOL) for depositing and patterning metal features of the device. As is known in the art, the metallisation stack may include one or more metal levels comprising patterned metal features. Each metal level in the metallisation stack may be separated from adjacent metal levels in the stack by a layer of intervening dielectric. Vias containing an electrically conductive material may be located in the intervening dielectric layers to allow the patterned metal features in a given metal level of the stack to be electrically connected to the patterned metal features in other metal levels (e.g. adjacent metal levels) in the stack.

Figure 5:
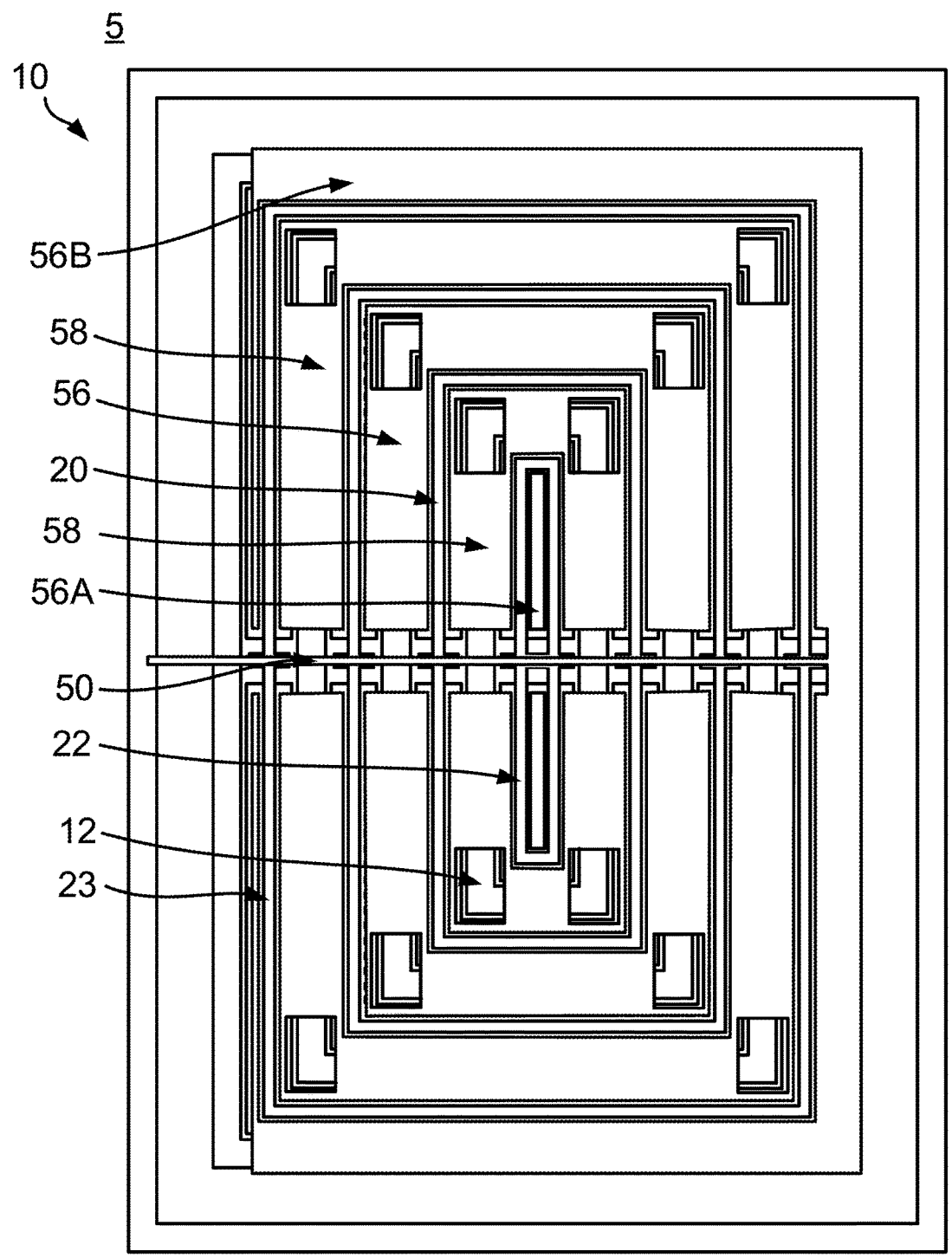

FIG. 5 shows a next stage in the manufacture of the device 10, in which a first metal level of a metallisation stack is formed. In this example, the first metal level of the metallisation stack includes a number of connection members. These connection members may allow electrical connections to be made to the gate contacts 40, source contacts 46 and drain contact 48 described above in relation to FIG. 4.

In this example, the connections members include a gate connection member 50. The gate connection member 50 may be a linear connection member, which extends within the plane of the first metal level, and along the common radial direction 34 discussed in relation to FIG. 2. Note that the gate contacts 40 in this example each extend vertically upward from the contact areas 30, 32 to connect with an underside of the gate connection member 50. As described above, the arrangement of the gate contact areas 30, 32, the gate contacts 40 and the gate connection member 50 may allow electrical connections to be made for applying a potential to the gates 20, 22 in a manner that is balanced and symmetrical. Note that the location of the gate connection member 50 also takes up a minimal amount of space within the metallisation stack, allowing more space to be provided for forming the source and gate connection members described below.

In this example, the connection members also include a plurality of source connection members 56 and drain connection members 58. The source connection members 56 and drain connection members may all extend within the plane of the first metal level of the metallisation stack. Note that the source contacts 46 in this example each extend vertically upward from the source regions 6 to connect with an underside of the source connection members 56, and the drain contacts 48 in this example each extend vertically upward from the drain regions 8 to connect with an underside of the drain connection members 58. The source connection members 56 and the drain connection members 58 may be patterned within the first metal level so as to receive and connect with the source contacts 46 and drain contacts 48 which, as noted above, are generally arranged in a series of loops corresponding to the loops formed by the source regions 6 and drain regions 8.

In this example, the source connection members 56 include an innermost source connection member 56A, which connections to the source contacts 46 of the innermost source region 6A. The innermost source connection member 56A may comprise two parts, each part being provided on either side of the gate connection member 50. Each part of the innermost source connection member 56A may have a generally linear shape, as shown in FIG. 5. The source connection members 56 may also include an outermost source connection member 56B. The outermost source connection member 56B may be generally arranged as a loop, for receiving and connection to the source contacts 46 of the outermost source region 6B. Note that the loop formed by the outermost source connection member 56B may include an opening to allow passage of the gate connection member 50 to the central region of the device 10. The source connection members 56 may also include one or more intermediate source connection members 56, which are located between the innermost source connection member 56A and the outer most source connection member 56B. Each intermediate source connection member 56 may connect to the source contacts 56 of more than one source region 6. For instance, in the present example, the device includes an intermediate source connection member 56 which connects to the source contacts 46 of two of the source regions 6 located on either side of one of the isolation regions 2.

In this example, the drain connection members 58 are located in between the source connection members 56A, 56, 56B. As with the intermediate source connection members 56, each drain connection member 58 may connect to drain contacts 58 of more than one drain region 8. For instance, in the present example, the device 10 includes drain connection members 58 which each connect to the drain contacts 46 of two of the drain regions 8 located on either side of a respective one of the isolation regions 2. Note that one of the drain connection members 58 in this example connects to the drain contacts 48 of the outermost drain region 8B.

As can be seen in FIG. 5, the loops formed by the source connection members 56 and the drain connection members 58 may be arranged concentrically. The centers of these loops may coincide with the centers of the loops formed by the isolation regions 2, gates 20, 22, source regions 6 and drain regions 8 as already described above. The loops formed by the source connection members 56 and the drain connection members 58 may be substantially rectangular (e.g. oblong or square) when viewed from above the major surface 5 of the substrate. Note also that each of the drain connection members 58 and the intermediate source connection members 56 may comprise two substantially U-shaped parts (halves), with each part (half) being located on either side of the gate connection member 50. This arrangement may allow space for the gate connection member 50 to pass through the source connection members 56 and drain connection members 58 to access the central region of the device 10.

Figure 6:
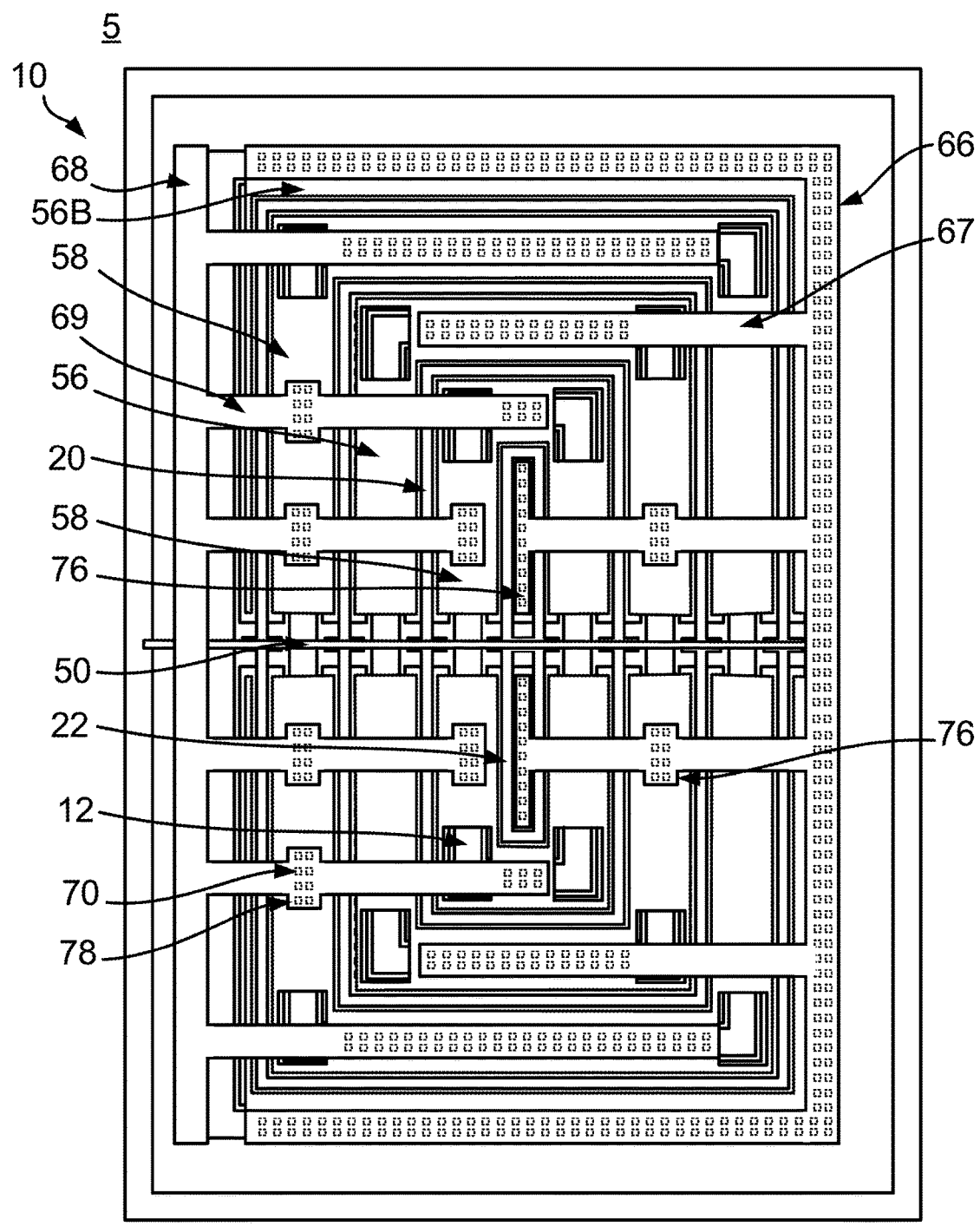

FIG. 6 shows a next stage in the manufacture of the device 10, in which a second metal level of the metallisation stack is formed above the first metal level described above in relation to FIG. 5. The second metal level includes a number of patterned metal features which form a further source connection member 66 and a further drain connection member 68. Each further source connection member 66 and further drain connection member 68 may extend within the plane of the second metal level of the metallisation stack.

The further source connection member 66 may electrically interconnect each of the source connection members 56 located in the first metal level of the metallisation stack. Similarly, the further drain connection member 68 may electrically interconnect each of the drain connection members 58 located in the first metal level of the metallisation stack. As described above, vias 70 filled with electrically conductive material may extend (usually vertically) through a dielectric layer which may separate the first metal level and the second metal level. The vias 70 may be located in positions appropriate for allowing connections to be formed between the connection members in each level, with the layout of the vias 70 shown in FIG. 6 being just an example. Note that the further source connection member 68 located in the second metal level may be provided with one or more island regions 76 to allow space for a local array of vias 70 to be provided for connection to underlying parts of the source connection members 56 in the first metal level. Similarly, the further drain connection member 68 may be provided with its own island regions 78.

In the example shown in FIG. 6, the further source connection member 66 and the further drain connection member 68 each comprise a plurality of fingers 67, 69. The fingers 67 of the further source connection member 66 and the fingers 69 of the further drain connection member 68 may be interdigitated. This arrangement may reduce insertion losses in the device 10. The fingers 67, 69 may extend over the connection members located in the first metal level, so as to allow connection to be made to them using the vias 70. Each finger 67 of the further source connection member 66 and each finger 69 of the further drain connection member 68 may extend along a common direction (which in the present example is parallel to the axis 34 described above in relation to FIG. 2).

Each finger 67 of the further source connection member 66 may extend from a side bar located at one side of the device 10. In this way, the fingers 67 may be interconnected, thus forming a common electrical connection to each source region 6 in the device 10. Similarly, each finger 69 of the further drain connection member 68 may extend from a side bar located at another side of the device 10. In this way, the fingers 69 may be interconnected, thus forming a common electrical connection to each drain region 8 in the device 10. Note that each finger 67, 69 may connect to more than one connection member located in the first metal level, and conversely each connection member in the first metal level may be connected to by more than one finger 67, 69.

Figure 7:
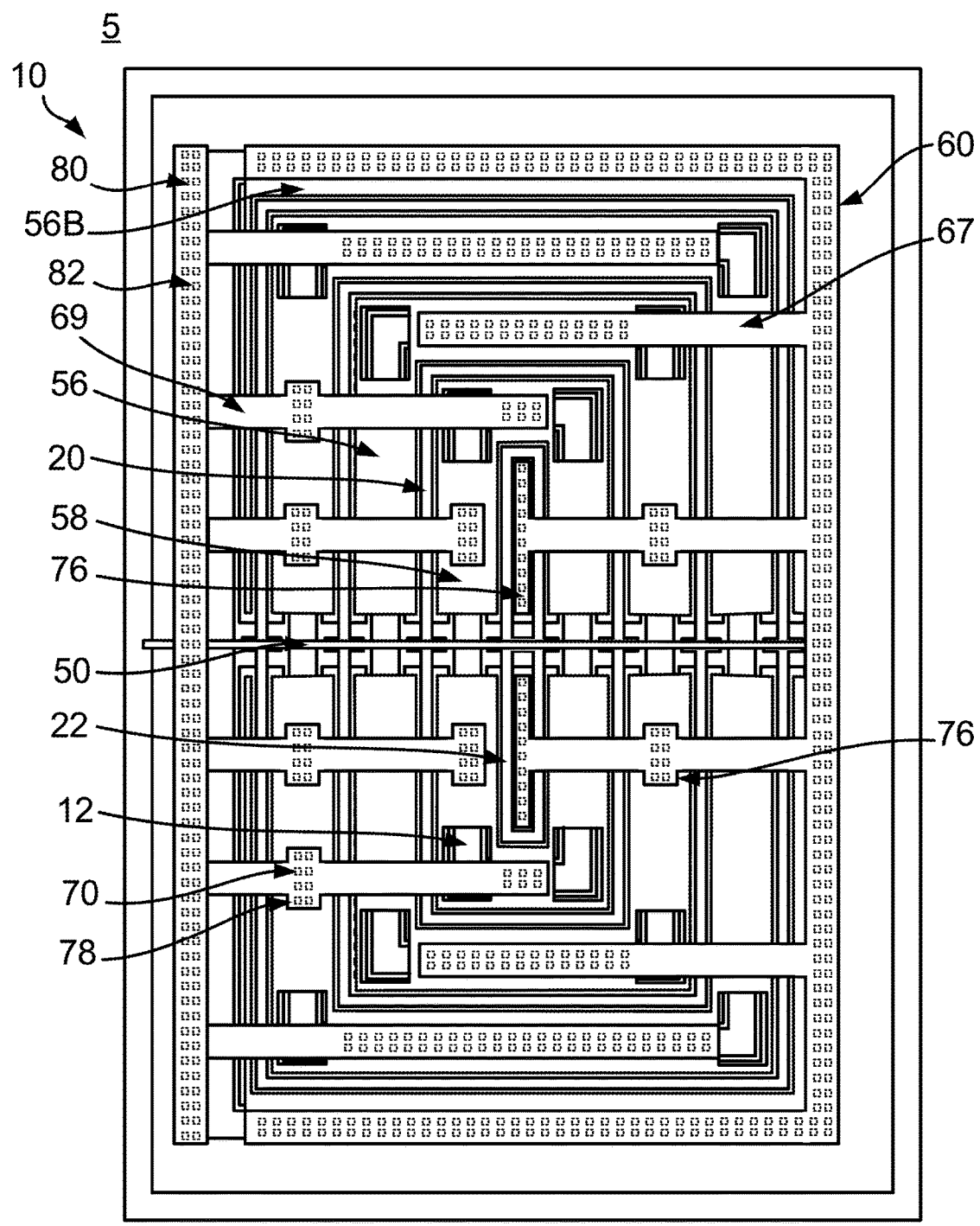

FIG. 7 shows a next stage in the manufacture of the device 10, in which a third metal level of the metallisation stack is formed above the second metal level described above in relation to FIG. 6. The third metal level includes a number of patterned metal features. In particular, in this example, the third metal level includes a drain connection member 80, for connection to the sidebar of the further drain connection member 68 in the second metal level. Vias 82 similar to those described above may be used electrically to connect the sidebar of the further drain connection member 68 to the connection member 80 located in the third metal level. It is envisaged that the further source connection member 66 may be provided with a similar connection in the third (or in a higher) metal level of the metallisation stack.

Accordingly, there has been described a semiconductor switch device and a method of making the same. The semiconductor switch device includes a field effect transistor located on a semiconductor substrate. The field effect transistor includes a plurality of gates. Each gate includes a gate electrode and gate dielectric arranged in a loop on a major surface of the substrate. The loops formed by the gates are arranged concentrically. Each gate has a source region located adjacent an inner edge or outer edge of the loop formed by that gate and a drain region located adjacent the other edge of said inner edge and said outer edge of the loop formed by that gate.

Although particular embodiments of this disclosure have been described, it will be appreciated that many modifications/additions and/or substitutions may be made within the scope of the claims.

The invention claimed is:

1. A semiconductor switch device comprising
a field effect transistor located on a semiconductor substrate,
wherein the field effect transistor comprises a plurality of gates,
each gate comprising a gate electrode and gate dielectric arranged in a loop on a major surface of the substrate,
wherein the loops formed by the gates are arranged concentrically;
wherein adjacent to each gate is
a source region located adjacent to one of an inner edge or an outer edge of the loop formed by that gate and
a drain region located adjacent to another of said inner edge or said outer edge of the loop formed by that gate;
wherein the field effect transistor includes at least one isolation region arranged in a loop; and
wherein the loop formed by the isolation region is located in between the source or drain region adjacent to the inner edge of one of said gates and the source or drain region adjacent to the outer edge of another of said gates.

2. A semiconductor switch device comprising
a field effect transistor located on a semiconductor substrate,
wherein the field effect transistor comprises a plurality of gates, each gate comprising a gate electrode and gate dielectric arranged in a loop on a major surface of the substrate,
wherein the loops formed by the gates are arranged concentrically;
wherein each gate has,
a source region located adjacent an inner edge or outer edge of the loop formed by that gate and
a drain region located adjacent the other edge of said inner edge and said outer edge of the loop formed by that gate;
further comprising a metallization stack located above the field effect transistor;
wherein the metallization stack includes connection members for connecting to the gates, sources and drains of the field effect transistor;
wherein the metallization stack includes,
at least one source connection member which connects together source regions located on either side of one of said isolation regions; and/or
at least one drain connection member which connects together drain regions located on either side of one of said isolation regions;
wherein each source connection member and each drain connection member is located in a first metal level of the metallization stack; and
wherein the metallization stack comprises further source and drain connection members located in a second metal level of the metallization stack for interconnecting the source connection members and the drain connection members in the first metal level.

3. The semiconductor switch device of claim 1,
wherein at least some of the source regions are located in between one of said isolation regions and either the inner edge or the outer edge of the loop formed by one of said gates, and wherein at least some of the drain regions are located in between one of said isolation regions and either the inner edge or the outer edge of the loop formed by one of said gates.

4. The semiconductor switch device of claim 1, wherein the plurality of gates include an outermost gate, an innermost gate and at least one intermediate gate, wherein the loop formed by the at least one intermediate gate is located inside the loop formed by the outermost gate, and wherein the loop formed by the innermost gate is located inside the loop formed by the at least one intermediate gate.

5. The semiconductor switch device of claim 1, wherein the loop formed by each gate is rectangular.

6. The semiconductor switch device of claim 1, wherein each gate comprises at least one contact area which extends along a common radial direction of the concentrically arranged loops, wherein the device further includes a linear array of gate contacts, and wherein each gate contact is located on one of said contact areas.

7. The semiconductor switch device of claim 6, wherein each gate comprises two said contact areas located on opposite sides of the loop formed by that gate.

8. The semiconductor switch device of claim 1, comprising either an innermost source region or an innermost drain region located at a center of the field effect transistor.

9. The semiconductor switch device of claim 1 comprising an array of source contacts and an array of drain contacts, wherein the arrays of source and drain contacts are arranged in loops for connecting to the source and drain regions.

10. The semiconductor switch device of claim 1, further comprising a metallisation stack located above the field effect transistor, wherein the metallisation stack includes connection members for connecting to the gates, sources and drains of the field effect transistor.

11. The semiconductor switch device of claim 10 wherein the metallisation stack includes a linear gate connection member extending along said common radial direction to connect to each of said gate contacts.

12. The semiconductor switch device of claim 10 wherein the metallisation stack includes:

at least one source connection member which connects together source regions located on either side of one of said isolation regions, and/or at least one drain connection member which connects together drain regions located on either side of one of said isolation regions.

13. The semiconductor switch device of claim 12, wherein each source connection member and each drain connection member is located in a first metal level of the metallisation stack, and wherein the metallisation stack comprises further source and drain connection members located in a second metal level of the metallisation stack for interconnecting the source connection members and the drain connection members in the first metal level.

14. The semiconductor switch device of claim 13, wherein the further source and drain connection members located in the second metal level of the metallisation stack comprise a plurality of interdigitated fingers.

15. A method of making a semiconductor switch device, the method comprising:

providing a semiconductor substrate having a major surface; and forming a field effect transistor on the semiconductor substrate by:

depositing and patterning a gate dielectric material and a gate electrode material on the substrate to form a plurality of gates, each gate comprising a gate electrode and gate dielectric arranged in a loop on the major surface of the substrate, wherein the loops formed by the gates are arranged concentrically;

for each gate, forming a source region located adjacent to one of an inner edge or an outer edge of the loop formed by that gate and a drain region located adjacent to another of said inner edge or said outer edge of the loop formed by that gate;

wherein the field effect transistor includes at least one isolation region arranged in a loop; and wherein the loop formed by the isolation region is located in between the source or drain region adjacent to the inner edge of one of said gates and the source or drain region adjacent to the outer edge of another of said gates.

* * * * *